(12) United States Patent
Wunderer et al.

(10) Patent No.: US 11,848,371 B2
(45) Date of Patent: Dec. 19, 2023

(54) POLARIZATION CONTROLLED TRANSISTOR

(71) Applicant: Palo Alto Research Center Incorporated, Palo Alto, CA (US)

(72) Inventors: Thomas Wunderer, Santa Cruz, CA (US); Jengping Lu, Fremont, CA (US); Noble M. Johnson, Menlo Park, CA (US)

(73) Assignee: XEROX CORPORATION, Norwalk, CT (US)

( * ) Notice: Subject to any disclaimer, the term of this patent is extended or adjusted under 35 U.S.C. 154(b) by 148 days.

(21) Appl. No.: 16/920,249

(22) Filed: Jul. 2, 2020

(65) Prior Publication Data

US 2022/0005938 A1 Jan. 6, 2022

(51) Int. Cl.
*H01L 29/778* (2006.01)
*H01L 29/66* (2006.01)
*H01L 29/20* (2006.01)

(52) U.S. Cl.
CPC .... *H01L 29/66462* (2013.01); *H01L 29/2003* (2013.01); *H01L 29/7786* (2013.01); *H01L 29/7787* (2013.01); *H01L 29/7788* (2013.01)

(58) Field of Classification Search
CPC ............. H01L 29/7787; H01L 29/7788; H01L 29/66462
See application file for complete search history.

(56) References Cited

U.S. PATENT DOCUMENTS

| | | | |
|---|---|---|---|
| 7,863,648 B2 | 1/2011 | Miyamoto et al. | |
| 8,203,376 B2 | 6/2012 | Morita et al. | |
| 8,338,860 B2 | 12/2012 | Bhalla et al. | |
| 8,785,976 B2 * | 7/2014 | Nakajima | H01L 29/42316 438/237 |
| 9,401,455 B1 | 7/2016 | Zhang et al. | |
| 9,660,134 B1 | 5/2017 | Northrup et al. | |
| 2012/0319127 A1* | 12/2012 | Chowdhury | H01L 29/66204 257/E29.089 |
| 2013/0221434 A1* | 8/2013 | Okada | H01L 29/407 438/270 |

(Continued)

OTHER PUBLICATIONS

Xie, Z. "Donor and Acceptor characteristics of native point defects in GaN" Jour. Of App. Phys. vol. 52, No. 33 Jun. 18, 2019 pp. 1-16 (Year: 2019).*

(Continued)

*Primary Examiner* — Grant S Withers
(74) *Attorney, Agent, or Firm* — Mueting Raasch Group

(57) ABSTRACT

A transistor includes a first layer comprising a group III-nitride semiconductor. A second layer comprising a group III-nitride semiconductor is disposed over the first layer. A third layer comprising a group III-nitride semiconductor is disposed over the second layer. An interface between the second layer and the third layer form a polarization heterojunction. A fourth layer comprising a group III-nitride semiconductor is disposed over the third layer. An interface between the third layer and the fourth layer forms a pn junction. A first electrical contact pad is disposed on the fourth layer. A second electrical contact pad is disposed on the third layer. A third electrical contact pad is electronically coupled to bias the polarization heterojunction.

20 Claims, 5 Drawing Sheets

(56) References Cited

U.S. PATENT DOCUMENTS

| | | | | |
|---|---|---|---|---|
| 2013/0248876 | A1* | 9/2013 | Yaegashi | H01L 29/41741 438/268 |
| 2015/0155273 | A1* | 6/2015 | Nakajima | H01L 29/04 257/76 |
| 2015/0279961 | A1 | 10/2015 | Huang et al. | |
| 2016/0079410 | A1* | 3/2016 | Yasumoto | H01L 29/04 257/329 |
| 2016/0329421 | A1* | 11/2016 | Shibata | H01L 29/7788 |

OTHER PUBLICATIONS

Mizutani, T. "A Study on Current Collapse in AlGaN/GaN HEMTs Induced by Bias Stress" IEEE Trans on Elec. Dev. vol. 50 No. 10 Oct. 2003 pp. 2015-2020 (Year: 2020).*

Lenka, T. R. "A comparative 2DEG Study of InxAl1-xN/(In, Al, Ga) N/GaN-based HEMTs" Phys. Procedia 25 copyright 2012 pp. 36-43 (Year: 2012).*

Lenka, T. R. "2DEG Transport Characteristics by Self-consistent Subband Calculations of Schrodinger and Poisson Equations in InAlN/GaN HEMT" 2014 IEEE 9th Nano. Mat. And Dev. Conf. NMDC Dec. 29, 2014 pp. 124-127 (Year: 2014).*

Wang, W. "Improvement of Power Performance of GaN HEMT by Using Quaternary InAlGaN Barrier" Jour. Of Elec. Dev. Soc. Feb. 16, 2018 pp. 360-364 (Year: 2018).*

Article on "Vertical GaN Devices for a New Power Electronics" by the editorial staff and published first on May 18, 2020 but with a wayback machine archiving date of May 7, 2020 in any event, being available online at https://www.powerelectronicsnews.com/vertical-gan-devices-for-a-new-power-electronics/ (Year: 2020).*

Firoz, S. "Comparison of AlGaN/GaN and AlGaAs/GaAs based HEMT device under doping consideration" Int. Jour. Of Adv. In Eng. And Tech. May 2011 pp. 12-19 (Year: 2011).*

Akasaki, I. "Conductivity control of GaN and Fabrication of UV/blue GaN light emitting devices" Physica B 185 copyright 1993 pp. 428-432 (Year: 1993).*

Zhu, T. "Unintentional doping in GaN" Phys. Chem. Chem. Phys. 14, May 18, 2012, pp. 9558-9573 (Year: 2012).*

Krishnamoorthy et al., "Polarization-engineered Ga/InGaN/GaN tunnel diodes", Appl. Phys. Lett, 97, 2010, 11 pages.

Li et al., "Polarization-Engineer III-Nitride Heterojunction Tunnel Field-Effect Transistors", IEEE Journal on Exploratory Solid-State Computational Devices and Circuits, vol. 1, Jul. 16, 2015, pp. 28-34.

Madathil, "Polarization junctions increase nitride transistor breakdown voltage", Semiconductor Today, vol. 6, Issue 2, Apr./May 2011, pp. 98-99.

Nakajima et al., "High Density Two-Dimensional Hole Gas Induced by Negative Polarization at GaN/AlGaN Herterointerface", The Japan Society of Applied Physcis, vol. 3, No. 12, Dec. 10, 2020, 3 pages.

* cited by examiner

POLARIZATION CONTROLLED TRANSISTOR

BACKGROUND

Nearly all of today's commercial GaN-based electronics are based on the lateral HEMT (high electron mobility transistor) technology. In a typical GaN-HEMT a 2-dimensional electron gas (2-DEG) is formed at a GaN/AlGaN or GaN/AlInN interface that acts as the channel medium. This device type allows high frequency switching. However, both high voltage and high current operations are limited due to the comparable small channel width of the 2-DEG. Today's Si-based power electronics and switching technologies include metal-oxide-semiconductor field effect transistors (MOSFET), insulated-gate bipolar transistors (IGBTs) and thyristors. Due to their current price advantage silicon power devices can be found in many applications, but they have several important limitations. This includes low switching frequencies, higher losses, and poor high-temperature performance, which are expected to be overcome by using wide bandgap materials such as GaN.

SUMMARY

Some embodiments are directed to a transistor. The transistor includes a first layer comprising a group III-nitride semiconductor. A second layer comprising a group III-nitride semiconductor is disposed over the first layer. A third layer comprising a group III-nitride semiconductor is disposed over the second layer. An interface between the second layer and the third layer form a polarization heterojunction. A fourth layer comprising a group III-nitride semiconductor is disposed over the third layer. An interface between the third layer and the fourth layer forms a pn junction. A first electrical contact pad is disposed on the fourth layer. A second electrical contact pad is disposed on the third layer. A third electrical contact pad is electronically coupled to bias the polarization heterojunction.

Some embodiments are directed to a circuit comprising at least a transistor and a power supply. The transistor includes a first layer comprising a group III-nitride semiconductor. A second layer comprising group III-nitride semiconductor is disposed over the first layer. A third layer comprising a group III-nitride semiconductor is disposed over the second layer. An interface between the second layer and the third layer forms a polarization heterojunction. A fourth layer comprises group III-nitride semiconductor and is disposed over the third layer. An interface between the third layer and the fourth layer forms a pn junction. A first electrical contact pad is disposed on the fourth layer. A second electrical contact pad is disposed on the third layer. The transistor includes third electrical contact pad. The voltage source is arranged to apply a voltage between the first contact pad and the second contact pad. The voltage controls a current flowing between the second and third contact pads.

Some embodiments are directed to a method of operating a transistor. The transistor includes a first layer comprising a group III-nitride semiconductor. A second layer comprising a group III-nitride semiconductor is disposed over the first layer. A third layer comprising a group III-nitride semiconductor is disposed over the second layer. A fourth layer comprising a group III-nitride semiconductor is disposed over the third layer. The first contact pad is disposed on the fourth layer. The second contact pad is disposed on the third layer. The third contact pad is electronically coupled such that current flows through the third contact pad. The method includes applying a voltage between a first contact pad disposed on a fourth layer of the transistor and a second contact pad disposed on a third layer of the transistor. The voltage controls polarization of a polarization heterojunction between a second layer of the transistor and the third layer. Controlling the polarization of the polarization heterojunction comprises controlling the current flowing between the second contact pad and a third contact pad of the transistor.

Some embodiments involve a method of making a transistor. A second layer comprising a group III-nitride semiconductor is formed over a first layer comprising a group III-nitride semiconductor. A third layer comprising a group III-nitride semiconductor is formed over the second layer such that a polarization heterojunction is formed at an interface between the second layer and the third layer. A fourth layer comprising a group III-nitride semiconductor is formed over the third layer such that a pn junction is formed at an interface between the third and fourth layers. A first contact is formed on the fourth layer. A second contact is formed on the third layer. A third contact is formed such that the third contact is electronically coupled to bias the polarization heterojunction.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Embodiments described herein are related to an electronic transistor device useful for high power operation. High currents and high voltages are required by many power applications such as electric vehicles and renewable energy processes such as wind turbines, PV converters, etc. The transistor described is compatible with the high-power levels needed for these applications.

Figure 1:
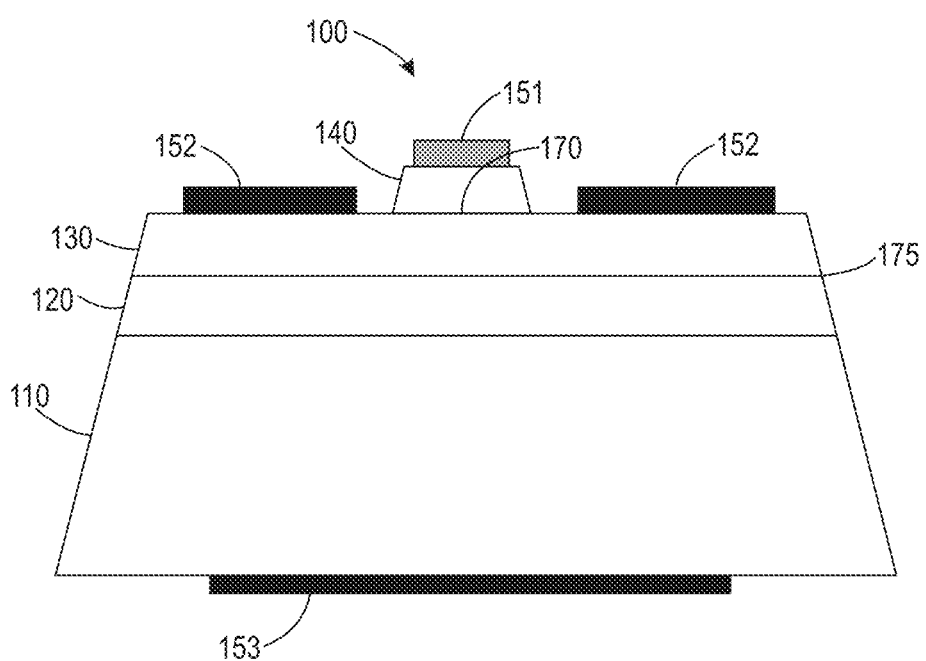
FIG. 1 is a schematic diagram of a polarization controlled transistor in accordance with some embodiments.

The breakdown electrical field for a material is proportional to the material's bandgap. Thus, the transistor implementation discussed herein is based on high band gap materials such as the group III-Nitrides that allow high voltage operation. The disclosed transistor employs a thick, low-doped drift region for operation to achieve operation voltages greater than 600 V, greater than 800 V or even greater than 1000 V. The drift region may be greater than 6 µm, greater than 8 µm, or even 10 µm, for example. The high current handling capability can be enabled through a true vertical device architecture that allows lateral device scaling and limited current densities with comparably wide current channels. In some embodiments, the current through the device, e.g. from the second contact pad to the third contact pad as discussed below, may exceed 10 amps. FIG. 1 is a schematic diagram of a transistor 100 in accordance with some embodiments. The transistor is a vertical device that includes a first layer 110 comprising a group III-nitride semiconductor layer. The first layer 110 may be grown on a substrate, such as a GaN substrate, for example. If the substrate is conductive, the substrate can be part of the device. In some implementations, the substrate may be thinned to a specific thickness when thermal management should be improved. In some cases, the substrate (e.g., Si, sapphire) could be entirely removed. The configuration with the substrate removed is shown in FIG. 1. In many applications, however, highest quality material is desired for the high power applications and a substrate, e.g., comprising GaN, would be employed. In some implementations, the first group III-nitride semiconductor layer 110 is a low doped drift region having a doping concentration less than about $1 \times 10^{17}$ cm$^{-3}$ and a thickness greater than about 5 μm.

A second group III-nitride semiconductor layer 120 is disposed over the first group III-nitride semiconductor layer. A third group III-nitride semiconductor layer 130 is disposed over the second group III-nitride semiconductor layer 120. A fourth group III-nitride semiconductor layer 140 disposed over the third group III-nitride semiconductor layer 130. A first contact pad 151 for making electrical contact to the semiconductor layer is disposed on the fourth group III-nitride semiconductor layer 140. A second contact pad 152 is disposed on the third group III-nitride semiconductor layer 130. A third contact pad 153 is electronically coupled to bias the polarization heterojunction 175. The third contact pad 153 may be the disposed on a surface of the first group III-nitride semiconductor layer 110 opposite the second group III-nitride semiconductor layer 120 as shown in FIG. 1. In other implementations, the third electrical contact pad could be disposed be on the backside of a conductive substrate (e.g., GaN substrate). Alternatively, the third contact pad could be placed laterally (on the same side as the other contacts 151, 152), for example when a non-conductive substrate is used and no substrate removal implemented).

The structure of the transistor shown in FIG. 1 includes a pn junction 170 and a polarization heterojunction 175. The term "heterojunction" denotes that at least one layer of the layer stack is made of dissimilar semiconductor material, such as the second and third layers 120, 130. A voltage across the second and third contact pads 152, 153 biases the polarization heterojunction 175. A voltage across the first and second 151, 152 biases the PN junction and controls the current through the heterojunction 175.

The third nitride semiconductor layer 130 is doped with a first type of dopant, either acceptor (p-type) or donor (n-type), and the fourth nitride semiconductor layer 140 is doped with the opposite type of dopant, such that the interface between the third and fourth layers forms a pn junction 170. In some embodiments, the pn junction 170 may be a pn homo-junction meaning that the third and fourth layers are made of the same type of semiconductor material. In some embodiments, the distance between the polarization heterojunction and the pn junction can be between 25 nm and 500 nm, for example.

The polarization heterojunction 175 is formed between the second group III-nitride semiconductor layer 120 and the third group III-nitride semiconductor layer 130. The polarization heterojunction 175 has fixed charges of a polarity on one side of the layer 120 and fixed charges of an opposite polarity on an opposite side of the layer 120. When unbiased, the pn junction 170 comprises a first electric field that opposes the flow of carriers across the pn junction 170 and the polarization heterojunction 175 comprises a second electric field that opposes the flow of oppositely charged carriers across the polarization heterojunction 175.

Due to their wurtzite crystal structure and ionicity, nitride semiconductors grown epitaxially along the (0001) plane exhibit piezoelectric and/or spontaneous polarization. At heterostructure interfaces, such as the polarization heterojunction 175, the polarization of the nitride semiconductors on either side of the interface leads to a polarization field that is a function of the sum of the piezoelectric and the spontaneous polarization field components of the nitride semiconductor materials that form the polarization junction. When nitride semiconductors are used in the transistor of FIG. 1, a difference in polarization between the second and third group III-nitride semiconductor layers 120, 130 at the polarization heterojunction is greater than $2 \times 10^{-2}$ C/m$^2$ or even greater than $3 \times 10^{-2}$ C/m$^2$.

In some embodiments, the second nitride semiconductor layer is n-doped, the third nitride semiconductor layer is n-doped, and the fourth nitride semiconductor layer is p-doped. A doping concentration of n-doped layers may be on the order of $10^{17}$ to $10^{19}$ cm$^{-3}$ and a doping concentration of p-doped layers may be on the order of $10^{18}$ to $10^{20}$ cm$^{-3}$. Alternatively, in some embodiments, the second nitride semiconductor layer is p-doped, the third nitride semiconductor layer is p-doped, and the fourth nitride semiconductor layer is n-doped. In some embodiments, the second nitride semiconductor layer may have a dopant concentration of the same order of magnitude as the third nitride semiconductor layer with the same doping concentrations as those indicated in the paragraph above.

Figure 2:
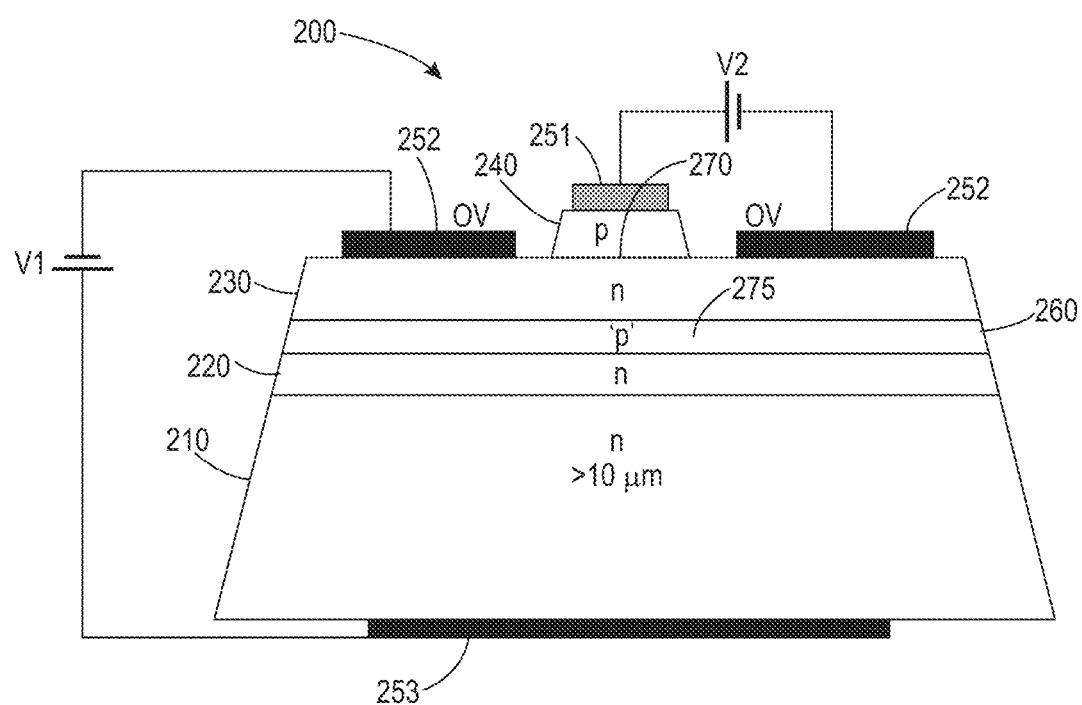
FIG. 2 is a schematic diagram of a polarization controlled transistor showing biasing voltages in accordance with some embodiments.

FIG. 2 is a schematic diagram illustrating the operation of a polarization controlled transistor 200 in more detail. In this particular embodiment, the first group III-nitride semiconductor layer 210 is an n-type layer; the second group III-nitride semiconductor layer 220 is an n-type layer; the third group III-nitride semiconductor layer 230 is an n-type layer; and the fourth group III-nitride semiconductor layer 240 is a p-type layer.

The fourth and third group III-nitride semiconductor layers 240, 230 form a pn junction 270. The material of the third group III-nitride semiconductor layer 230 is different from the material of the second group III-nitride semiconductor layer 220 forming a polarization heterojunction 275 at the interface of the second and third layers 220, 230.

As indicated in FIG. 2, the heterostructure of transistor 200 is essentially a pn'p'n stack whereas the inner 'p'-type layer 260 is not intentionally p-type doped, but it acts as such. The 'p'-type properties result from strong polarization fields at the heterointerface of the transistor layer stack between the second 220 and third 230 layers. For example, the desired polarization field can occur from the spontaneous and piezoelectric polarization fields that are formed at a GaN/AlInN or GaN/AlGaN heterointerface. The barrier due to the polarization field at the polarization heterojunction 275 can be altered by a relatively small applied external voltage V2.

A voltage V1, can be applied across the second 252 and third 253 contact pads to bias the polarization heterojunction 275. The voltage V1 may be a relatively high voltage such as about 1000V, and is applied across the relatively thick, e.g., greater than about 10 μm, drift region of layer 210 and the embedded n'p'n section formed by layers 220 and 230. The drift region is low-doped for low electrical conductivity, e.g., doped at $10^{15}$-$10^{17}$ cm$^{-2}$. In the 'OFF' state (e.g., V2=0) of the transistor operation no current can pass through the reverse-biased 'p'-n junction. In the 'OFF' state the polarization barrier blocks electrons flowing from the n-GaN layer 230 to the third contact pad 253.

When a relatively small voltage V2, e.g., about 4V, is applied in the forward direction to the pn junction 270 across contacts 251 and 252, carriers are supplied through the pn junction 270 towards the 'p'-n polarization heterojunction 275. The carriers supplied to the 'p' n junction region reduce the effective blocking behavior of that 'p' n barrier at the polarization heterojunction 175, turning the transistor to the 'ON' state. Thus, electron flow can occur over the polarization barrier that was previously blocked. When the transistor is "ON" high current can flow in the vertical direction through the transistor 200 from the first contact pad 251 to the third contact pad 253.

Figure 3:
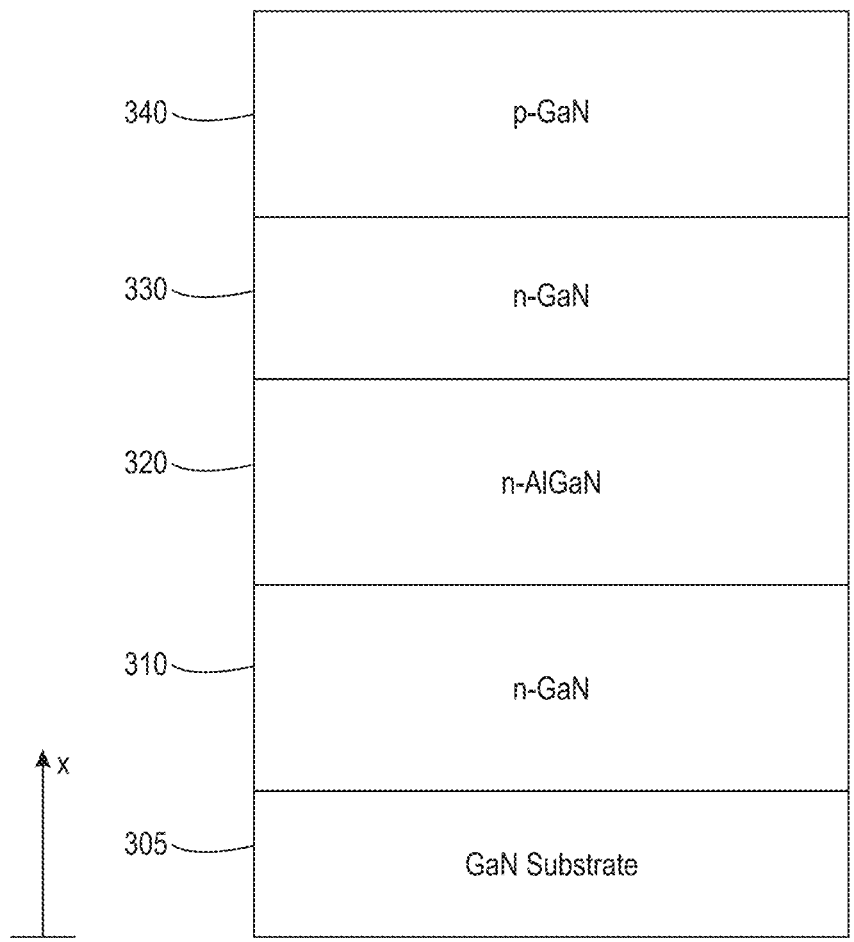
FIG. 3 is a diagram of a layer structure of a polarization controlled transistor in accordance with some embodiments.

FIG. 3 illustrates a transistor heterostructure 300 comprising an n-GaN-n-AlGaN heterojunction interface between layers 320 and 330. As illustrated in FIG. 3, the transistor structure comprises an n-GaN layer 310 disposed over a GaN substrate 305. An n-AlGaN layer 320 is disposed over the n-GaN layer 310. An n-GaN layer 330 is disposed over the AlGaN layer 320. A p-GaN layer 340 is disposed over the n-GaN layer 330. In other embodiments, an n-AlInN layer may be substituted for the AlGaN layer 320. In another embodiment, the n-AlGaN layer may be substituted an AlGaInN layer 320. And in another embodiment, a multi-layer heterostructure may be used featuring a similar combined polarization field as with a single layer. In some embodiments, the n-GaN layer 310 may be about 500 nm with doping concentration of about $5\times10^{18}$ cm$^{-3}$. Layer 320 may comprise n-Al$_x$Ga$_{1-x}$N (x about equal to 0.4) having a thickness of about 8 nm and a doping concentration of about $10^{18}$ cm$^{-3}$. Layer 330 may comprise n-GaN layer having a thickness of about 50 nm and a doping concentration of about $8\times10^{18}$ cm$^{-3}$. Layer 340 may comprise p-GaN having a thickness of about 200 nm and a doping concentration of about $3\times10^{19}$ cm$^{-3}$.

Note that for simplicity the contact pads of the transistor are not shown in FIG. 3.

As illustrated by the transistor structure of FIG. 3, the fourth nitride semiconductor layer 340 may be p-GaN doped with a p-type dopant, the third nitride semiconductor layer 330 may be GaN doped with an n-type dopant, and the first layer 310 may be an n-type doped GaN layer. The second nitride semiconductor layer 320 is a different nitride semiconductor material than the semiconductor material of the first layer 310 and the third layer 330, e.g., n-AlGaN.

FIG. 3 shows a transistor having an NNNP structure, meaning that layers 310, 320, 330, are doped n-type and layer 340 is doped p-type. However, in various embodiments, a transistor may have a PPPN, a NPPP, or a NNPP structure.

In some embodiments, the material of the second layer 320 may be a nitride semiconductor that comprises Al, e.g., AlGaN as shown in FIG. 3. Alternatively, the material of the second layer may be AlInN. Where AlInN is used, Al$_{1-x}$In$_x$N layer may have x is between 0.05 and 0.30. In some embodiments, the material of the second layer is a quaternary nitride semiconductor such as AlGaInN. The second nitride semiconductor layer 320 can be an Al$_{1-x}$In$_x$N layer, where x is between 0.10 and 0.25. Alternatively, the second nitride semiconductor can be an Al$_y$Ga$_{1-y}$N layer, wherein y is greater than 0.20 or even greater than 0.30.

The second nitride semiconductor layer 320 can be lattice matched to the first layer 310. For example, where the first layer 310 is n-type GaN and the second layer 320 is n-type AlInN, the lattice matching may involve choosing the In composition in the AlInN layer to be about 18%.

Si may be used as the n-type dopant and the Si concentration in the n-type layers, e.g., the first, second, and third layers 310, 320, 330, may be in a range of $N_D=1\times10^{17}$ to $1\times10^{19}$ Si/cm$^3$. Mg may be used as the p-type dopant such that the Mg concentration in the p-layer, e.g., the fourth layer 340 of the transistor structure 300, may be in a range of $N_A=1\times10^{18}$ to $1\times10^{20}$ Mg/cm$^3$. Any suitable n-type dopant, such as Ge, and any suitable p-type dopant could be used for doping the n-type and p-type layers.

Figure 4:
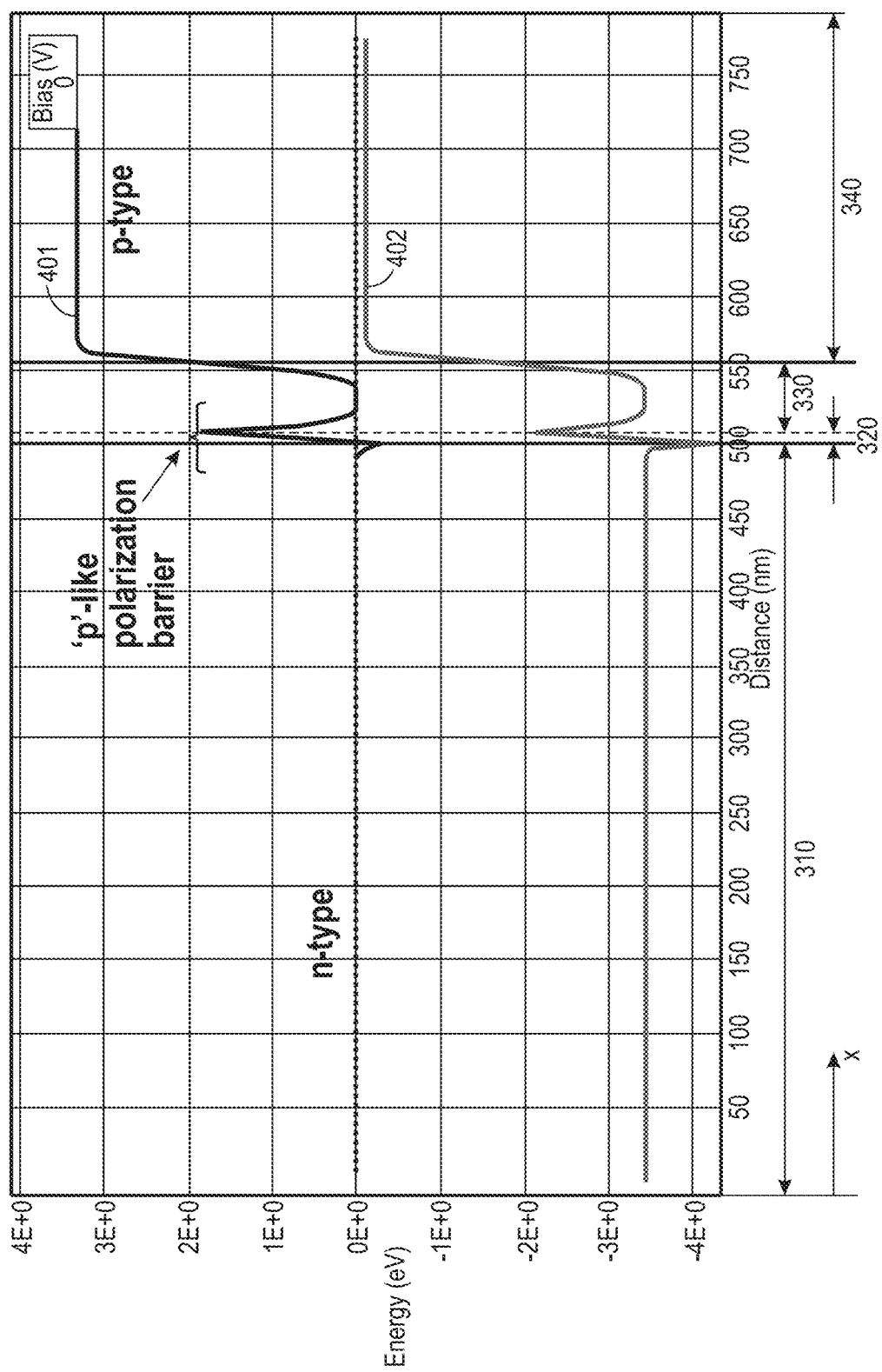
FIG. 4 is a band diagram for the layer structure shown in FIG. 3.

FIG. 4 is a band diagram of the heterostructure 300 illustrated in FIG. 3 showing the conduction 401 and valence bands 402 for the heterostructure 300 including first, second, and third layers 310, 320, 330. The location of the 'p' like polarization barrier that is present due to the formation of the 'p' type polarization layer is indicated in FIG. 4. As previously discussed, operation of the transistor involves applying a voltage V2 across the third and fourth layers of the transistor structure. Application of this voltage reduces the height of the 'p' like polarization barrier allowing carriers to flow through the transistor. Additional information relating to polarization junction devices can be found in commonly owned U.S. Pat. No. 9,660,134 which is incorporated herein by reference.

Figure 5:
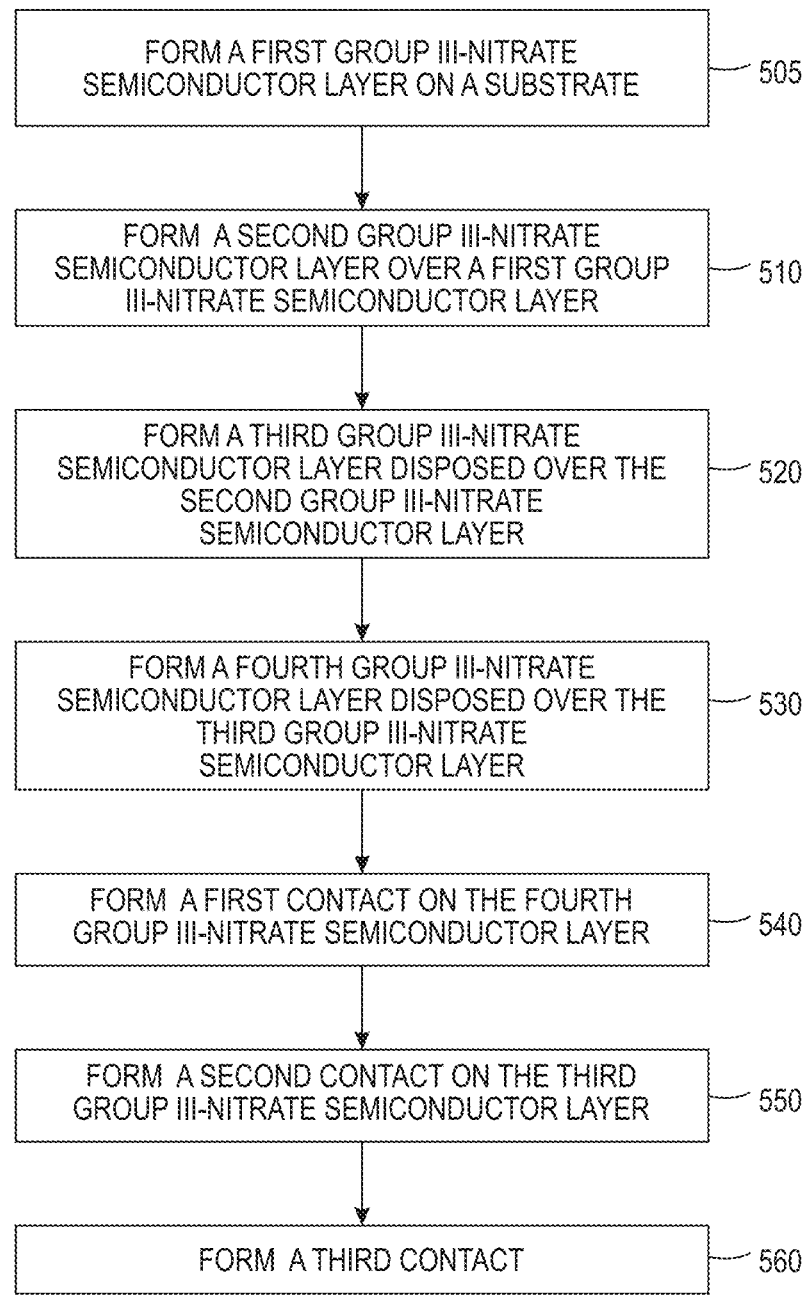
FIG. 5 is a flow diagram illustrating a method of fabricating a polarization controlled transistor in accordance with some embodiments.

FIG. 5 is a flow diagram illustrating a method for fabricating a transistor in accordance with some embodiments. The method includes forming 505 a first group III-nitride semiconductor layer over a substrate. In some embodiments, the first n-GaN layer might comprise at least two layers (one thick, e.g., 10 microns and low doped drift layer, and a thinner, e.g., 100-500 nm, higher doped n-GaN layer. A second group III-nitride semiconductor layer is formed 510 over a first group III-nitride semiconductor layer; forming 520 a third group III-nitride semiconductor layer disposed over the second group III-nitride semiconductor layer; and forming 530 a fourth group III-nitride semiconductor layer disposed over the third group III-nitride semiconductor layer. A first contact pad is formed 540 on the fourth group III-nitride semiconductor layer. A second contact pad is formed 550 on the third group III-nitride semiconductor layer. A third contact pad is formed 560. In some embodiments, where the substrate is removed, the contact pad is formed on a surface of the first group III-nitride semiconductor layer opposite the second group III-nitride semiconductor layer. Alternatively, the third contact pad may be formed on the backside of the substrate. Alternatively the third contact pad could optionally also be placed laterally, for example, when a non-conductive substrate is used. In this alternatively implementation, the layer heterostructure would still be the same as for a vertical device architecture.

A pn junction is formed at the interface between the third and fourth group III-nitride semiconductor layers. The material of the second group III-nitride semiconductor layer is different from the material of the third group III-nitride semiconductor layer forming a polarization heterojunction at the interface of the second and third layers. The polarization heterojunction has fixed charges of a polarity on one side of the polarization hetero junction and fixed charges of an opposite polarity on an opposite side of the polarization heterojunction. When unbiased, the pn junction comprises a first electric field that opposes the flow of carriers across the pn junction and the polarization heterojunction comprises a second electric field that opposes the flow of oppositely charged carriers across the polarization heterojunction.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of various embodiments has been presented for the purposes of illustration and description and not limitation. The embodiments disclosed are not intended to be exhaustive or to limit the possible implementations to the embodiments disclosed. Many modifications and variations are possible in light of the above teaching.

The invention claimed is:

1. A transistor comprising:
   a first layer comprising a first group III-nitride semiconductor, wherein the first layer is a low doped drift region having a doping less than $1 \times 10^{17}$ cm$^{-3}$ and a thickness greater than 5 μm;
   a second layer comprising a second group III-nitride semiconductor having a first surface disposed over and in physical contact with the first layer, a second surface of the second layer being opposed to the first surface of the second layer;
   a third layer comprising a third group III-nitride semiconductor, a first surface of the third layer disposed over and in physical contact with the second surface of the second layer, a second surface of the third layer being opposed to the first surface of the third layer, an interface between the second layer and the third layer forming a polarization heterojunction;
   a fourth layer comprising a fourth group III-nitride semiconductor disposed over and in physical contact with the second surface of the third layer, an interface between the third layer and the fourth layer forming a pn junction;
   a first electrical contact pad disposed on and in contact with the fourth layer;
   a second electrical contact pad disposed on and in contact with the third layer; and
   a third electrical contact pad electronically coupled to bias the polarization heterojunction;
   wherein current flows vertically through the transistor from the first electrical contact pad to the third electrical contact pad when the transistor is in forward biased operation.

2. The transistor of claim 1, wherein the second layer is n-doped, the third layer is n-doped and the fourth layer is p-doped.

3. The transistor of claim 2, wherein a first doping concentration of the n-doped second and third layers is on the order of $10^{17}$ to $10^{19}$ cm$^{-3}$ and a second doping concentration of the p-doped fourth layer is on the order of $10^{18}$ to $10^{20}$ cm$^{-3}$.

4. The transistor of claim 1, wherein a distance between the pn junction and the polarization heterojunction is between 25 nm and 500 nm.

5. The transistor of claim 1, wherein the second layer is an AlInN layer.

6. The transistor of claim 5, wherein the third layer is a GaN layer.

7. The transistor of claim 6, wherein the fourth layer is a second GaN layer.

8. The transistor of claim 5, wherein the AlInN layer is an $Al_{1-x}In_xN$ layer, wherein x is between 0.05 and 0.30.

9. The transistor of claim 1, wherein the second layer is an AlGaN layer.

10. The transistor of claim 9, wherein:
    the third layer is a GaN layer; and
    the fourth layer is a second GaN layer.

11. The transistor of claim 10, wherein the AlGaN layer is an $Al_yGa_{1-y}N$ layer, wherein y is greater than 0.20.

12. The transistor of claim 1, wherein a difference in polarization between the second and third layers at the polarization junction is greater than about $2 \times 10^{-2}$ C/m$^2$.

13. The transistor of claim 1, wherein a difference in polarization between the second and third layers at the polarization junction is greater than about $3 \times 10^{-2}$ C/m$^2$.

14. The transistor of claim 1, wherein the second layer is a quaternary AlGaInN layer.

15. The transistor of claim 1, wherein a breakdown voltage between the second contact and the third contact exceeds 600 volts.

16. The transistor of claim 1, wherein a maximum current through the transistor from the second contact to the third contact is greater than 10 amps.

17. The transistor of claim 1, wherein the third electrical contact pad is disposed on a surface of the first layer opposite the second layer.

18. A circuit comprising:
    a transistor that includes:
        a first layer comprising a first group III-nitride semiconductor, wherein the first layer is a low doped drift region having a doping less than $1 \times 10^{17}$ cm$^{-3}$ and a thickness greater than 5 μm;
        a second layer comprising a second group III-nitride semiconductor having a first surface disposed over and in physical contact with the first layer, a second surface of the second layer being opposed to the first surface of the second layer;
        a third layer comprising a third group III-nitride semiconductor, a first surface of the third layer disposed over and in physical contact with the second surface of the second layer, a second surface of the third layer being opposed to the first surface of the third layer, an interface between the second layer and the third layer forming a polarization heterojunction;
        a fourth layer comprising a fourth group III-nitride semiconductor disposed over and in physical contact with the second surface of the third layer, an interface between the third layer and the fourth layer forming a pn junction;
        a first electrical contact pad disposed on and in contact with the fourth layer;
        a second electrical contact pad disposed on and in contact with the third layer;
        a third electrical contact pad; and
    a voltage source arranged to apply a voltage between the first contact pad and the second contact pad, the voltage controlling a current flowing between the second and third contact pads.

19. The circuit of claim 18, wherein the second layer of the transistor is n-doped, the third layer of the transistor is n-doped and the fourth layer of the transistor is p-doped.

20. A method of making a transistor, comprising:
    forming a second layer comprising a second group III-nitride semiconductor, a first surface of the second layer formed over and in physical contact with a first layer comprising a first group III-nitride semiconductor, a second surface of the second layer being opposed to the first surface of the second layer, wherein the first layer is a low doped drift region having a doping less than $1 \times 10^{17}$ cm$^{-3}$ and a thickness greater than 5 µm;

forming a third layer comprising a third group III-nitride semiconductor over and in physical contact with the second surface of the second layer such that a polarization heterojunction is formed at an interface between the second layer and the third layer, a second surface of the third layer being opposed to a first surface of the third layer;

forming a fourth layer comprising a fourth group III-nitride semiconductor over and in physical contact with the second surface of the third layer such that a pn junction is formed at an interface between the third and fourth layers;

forming a first contact on and in contact with the fourth layer;

forming a second contact on and in contact with the third layer; and forming a third contact electronically coupled to bias the polarization heterojunction.

\* \* \* \* \*